United States Patent
Eurlings et al.

(10) Patent No.: US 7,026,082 B2
(45) Date of Patent: Apr. 11, 2006

(54) METHOD FOR DETERMINING PARAMETERS FOR LITHOGRAPHIC PROJECTION, A COMPUTER SYSTEM AND COMPUTER PROGRAM THEREFOR, A METHOD OF MANUFACTURING A DEVICE AND A DEVICE MANUFACTURED THEREBY

(75) Inventors: Markus Franciscus Antonius Eurlings, Tilburg (NL); Armand Eugene Albert Koolen, Eindhoven (NL)

(73) Assignee: ASML Netherlands B.V., Veldhoven (NL)

( * ) Notice: Subject to any disclaimer, the term of this patent is extended or adjusted under 35 U.S.C. 154(b) by 232 days.

(21) Appl. No.: 10/727,034

(22) Filed: Dec. 4, 2003

(65) Prior Publication Data

US 2004/0137343 A1    Jul. 15, 2004

(30) Foreign Application Priority Data

Dec. 9, 2002  (EP) .................................. 02258468

(51) Int. Cl.
*G03F 9/00* (2006.01)
*G06F 17/50* (2006.01)

(52) U.S. Cl. ............................ 430/30; 430/5; 430/311; 716/19; 716/20; 716/21

(58) Field of Classification Search .................... 430/5, 430/30, 311; 716/19, 20, 21
See application file for complete search history.

(56) References Cited

U.S. PATENT DOCUMENTS

| 6,045,976 | A | 4/2000 | Haruki et al. |
| 6,320,648 | B1 | 11/2001 | Brueck et al. |
| 6,519,760 | B1 * | 2/2003 | Shi et al. ...................... 716/19 |
| 6,871,337 | B1 * | 3/2005 | Socha .......................... 716/19 |

FOREIGN PATENT DOCUMENTS

| EP | 1 237 046 A2 | 9/2002 |
| EP | 1 239 331 A2 | 9/2002 |

* cited by examiner

Primary Examiner—Christopher G. Young
(74) Attorney, Agent, or Firm—Pillsbury Winthrop Shaw Pittman, LLP

(57) ABSTRACT

The method involves selecting features of a pattern to be imaged, notionally dividing the source into a plurality of source elements, for each source element, calculating the process window for each selected feature and then the OPC rules that optimize the overlap of the calculated process windows. Finally, those source elements are selected for which the overlapping of the process windows and the OPC rules satisfy specified criteria. The selected source elements define the source intensity distribution.

16 Claims, 5 Drawing Sheets

| i =1..N | j =1..M | M*N source elements |
|---|---|---|
|  |  |  |
| |  |  |
| ⋮ | ⋮ | ⋮ |
| |  |  |
|  |  |  |
| | ⋮ | ⋮ |

METHOD FOR DETERMINING PARAMETERS FOR LITHOGRAPHIC PROJECTION, A COMPUTER SYSTEM AND COMPUTER PROGRAM THEREFOR, A METHOD OF MANUFACTURING A DEVICE AND A DEVICE MANUFACTURED THEREBY

BACKGROUND OF THE INVENTION

This application claims priority to European Application No. 02258468.4 filed Dec. 9, 2002.

1. Field of the Invention

The present invention relates to the determination of parameters for use in lithographic projection apparatus.

2. Description of the Related Art

The term "patterning device" or "patterning structure" as here employed should be broadly interpreted as referring to structures that can be used to endow an incoming radiation beam with a patterned cross-section, corresponding to a pattern that is to be created in a target portion of the substrate; the term "light valve" can also be used in this context. Generally, the pattern will correspond to a particular functional layer in a device being created in the target portion, such as an integrated circuit or other device (see below). Examples of such patterning means include:

A mask. The concept of a mask is well known in lithography, and it includes mask types such as binary, alternating phase-shift, and attenuated phase-shift, as well as various hybrid mask types. Placement of such a mask in the radiation beam causes selective transmission (in the case of a transmissive mask) or reflection (in the case of a reflective mask) of the radiation impinging on the mask, according to the pattern on the mask. In the case of a mask, the support structure will generally be a mask table, which ensures that the mask can be held at a desired position in the incoming radiation beam, and that it can be moved relative to the beam if so desired.

A programmable mirror array. One example of such a device is a matrix-addressable surface having a viscoelastic control layer and a reflective surface. The basic principle behind such an apparatus is that (for example) addressed areas of the reflective surface reflect incident light as diffracted light, whereas unaddressed areas reflect incident light as undiffracted light. Using an appropriate filter, the said undiffracted light can be filtered out of the reflected beam, leaving only the diffracted light behind; in this manner, the beam becomes patterned according to the addressing pattern of the matrix-addressable surface. An alternative embodiment of a programmable mirror array employs a matrix arrangement of tiny mirrors, each of which can be individually tilted about an axis by applying a suitable localized electric field, or by employing piezoelectric actuation means. Once again, the mirrors are matrix-addressable, such that addressed mirrors will reflect an incoming radiation beam in a different direction to unaddressed mirrors; in this manner, the reflected beam is patterned according to the addressing pattern of the matrix-addressable mirrors. The required matrix addressing can be performed using suitable electronic means. In both of the situations described hereabove, the patterning means can comprise one or more programmable mirror arrays. More information on mirror arrays as here referred to can be gleaned, for example, from U.S. Pat. Nos. 5,296,891 and 5,523,193, and PCT Patent Application Nos. WO 98/38597 and WO 98/33096, which are incorporated herein by reference. In the case of a programmable mirror array, the said support structure may be embodied as a frame or table, for example, which may be fixed or movable as required.

A programmable LCD array. An example of such a construction is given in U.S. Pat. No. 5,229,872, which is incorporated herein by reference. As above, the support structure in this case may be embodied as a frame or table, for example, which may be fixed or movable as required.

For purposes of simplicity, the rest of this text may, at certain locations, specifically direct itself to examples involving a mask and mask table; however, the general principles discussed in such instances should be seen in the broader context of the patterning means as hereabove set forth.

Lithographic projection apparatus can be used, for example, in the manufacture of integrated circuits (ICs). In such a case, the patterning means may generate a circuit pattern corresponding to an individual layer of the IC, and this pattern can be imaged onto a target portion (e.g., comprising one or more dies) on a substrate (silicon wafer) that has been coated with a layer of radiation-sensitive material (resist). In general, a single wafer will contain a whole network of adjacent target portions that are successively irradiated via the projection system, one at a time. In current apparatus, employing patterning by a mask on a mask table, a distinction can be made between two different types of machine. In one type of lithographic projection apparatus, each target portion is irradiated by exposing the entire mask pattern onto the target portion in one go; such an apparatus is commonly referred to as a wafer stepper. In an alternative apparatus—commonly referred to as a step-and-scan apparatus—each target portion is irradiated by progressively scanning the mask pattern under the projection beam in a given reference direction (the "scanning" direction) while synchronously scanning the substrate table parallel or anti-parallel to this direction; since, in general, the projection system will have a magnification factor M (generally <1), the speed V at which the substrate table is scanned will be a factor M times that at which the mask table is scanned. More information with regard to lithographic devices as here described can be gleaned, for example, from U.S. Pat. No. 6,046,792, incorporated herein by reference.

In a manufacturing process using a lithographic projection apparatus, a pattern (e.g., in a mask) is imaged onto a substrate that is at least partially covered by a layer of radiation-sensitive material (resist). Prior to this imaging step, the substrate may undergo various procedures, such as priming, resist coating and a soft bake. After exposure, the substrate may be subjected to other procedures, such as a post-exposure bake (PEB), development, a hard bake and measurement/inspection of the imaged features. This array of procedures is used as a basis to pattern an individual layer of a device, e.g. an IC. Such a patterned layer may then undergo various processes such as etching, ion-implantation (doping), metallization, oxidation, chemo-mechanical polishing, etc., all intended to finish off an individual layer. If several layers are required, then the whole procedure, or a variant thereof, will have to be repeated for each new layer. Eventually, an array of devices will be present on the substrate (wafer). These devices are then separated from one another by a technique such as dicing or sawing, whence the individual devices can be mounted on a carrier, connected to pins, etc. Further information regarding such processes can be obtained, for example, from the book "Microchip Fabrication: A Practical Guide to Semiconductor Processing," Third Edition, by Peter van Zant, McGraw Hill Publishing Co., 1997, ISBN 0-07-067250-4, incorporated herein by reference.

For the sake of simplicity, the projection system may hereinafter be referred to as the "lens;" however, this term should be broadly interpreted as encompassing various types of projection system, including refractive optics, reflective optics, and catadioptric systems, for example. The radiation system may also include components operating according to any of these design types for directing, shaping or controlling the projection beam of radiation, and such components may also be referred to below, collectively or singularly, as a "lens." Further, the lithographic apparatus may be of a type having two or more substrate tables (and/or two or more mask tables). In such "multiple stage" devices the additional tables may be used in parallel, or preparatory steps may be carried out on one or more tables while one or more other tables are being used for exposures. Dual stage lithographic apparatus are described, for example, in U.S. Pat. No. 5,969,441 and WO 98/40791, incorporated herein by reference.

In lithography there is a problem known as the optical proximity effect. This is caused by the inherent difference in diffraction pattern for isolated features as compared to dense features. Dense features may include nested patterns and closely spaced periodic features. The optical proximity effect leads to a difference in critical dimension (CD) when dense and more isolated lines are printed at the same time. The lines are different when printed even though they are identical on the mask.

The optical proximity effect also depends on the illumination setting used. Originally, so-called conventional illumination modes have been used which have a disc-like intensity distribution of the illumination radiation at the pupil of the projection lens. However, with the trend to imaging smaller features, off-axis illumination modes have become standard in order to improve the process window, i.e., exposure and/or focus latitude, for small features. However, the optical proximity effect can become worse for off-axis illumination modes, such as annular illumination.

One solution to this problem has been to apply optical proximity correction (OPC) by biasing the different features on the reticle. According to one form of biasing, the features are biased, for example, by making the more isolated lines on the reticle somewhat thicker so that, in the image on the substrate, they are printed with the same transverse dimension as the dense lines. In another form of biasing, an end correction is applied so that the lines, whether isolated or dense, are printed with the correct length. However, at smaller pitches and with off-axis illumination, the greater the CD varies as a function of pitch, and so more line biasing has to be applied and the biasing becomes more complicated. Another form of optical proximity correction (OPC) is to use so-called "assist features" also known as "scatter bars" on the reticle to alter the diffraction of, for example, isolated features, such that they are printed with the correct dimension. OPC is discussed, for example, in U.S. Pat. No. 5,821,014 and in SPIE Vol. 4000, pages 1015 to 1023, "Automatic parallel optical proximity correction and verification system," Watanabe et al.

Techniques are also known for optimizing the spatial intensity distribution of the radiation source dependent on the pattern being imaged. According to one method the radiation source is divided into blocks and the system is modeled as being equivalent to a point source at each block which is either on or off. For each source point in turn the resulting intensity at selected points on the substrate is calculated. An optimization routine is then used to calculate the optimum source distribution comprising a plurality of illumination source blocks so as to minimize the difference between the calculated intensity at the substrate and the ideal intensity at the substrate for best printing of the pattern. Another technique is to calculate the difference between the actual intensity and ideal intensity for every block of the radiation source and place them in rank-order. The overall illumination intensity distribution is obtained by accepting the source blocks in rank order until the illumination reaches a threshold. Further details of these techniques can be obtained from U.S. Pat. No. 6,045,976, incorporated herein by reference.

As will be appreciated, advanced software algorithms and very complex mask making is required for OPC and similarly advanced software is required for source optimization. There has been a problem of satisfactorily combining OPC with simultaneously optimizing the illumination intensity distribution and providing an adequate process window with sufficient process latitude for a range of features or groups of features.

It is an aspect of embodiments of the present invention to alleviate, at least partially, the above problem. According to embodiments of the present invention there is provided a method for determining a projection beam source intensity distribution and optical proximity correction rules for a patterning device for use with a lithographic projection apparatus including: a radiation system for providing the projection beam of radiation, a support structure for supporting patterning device, the patterning device serving to pattern the projection beam according to a desired pattern, a substrate table for holding a substrate, a projection system for projecting the patterned beam onto a target portion of the substrate, selecting a plurality of features of the desired pattern to be imaged, notionally dividing the radiation in the radiation system into a plurality of source elements, for each source element: calculating the process window for each selected feature and determining the optical proximity correction rules that optimize the overlap of the calculated process windows, selecting those source elements for which the overlapping of the process windows and the optical proximity correction rules satisfy specified criteria, and outputting data on the selected source elements, which source elements define a source intensity distribution and optical proximity correction rules.

A further aspect of embodiments of the present invention provides a computer system comprising a data processor and data storage, the data processor being adapted to process data in accordance with an executable program stored in the data storage, wherein the executable program is adapted to execute the above method.

The invention also provides a computer program comprising program code for executing on a computer the above method, and a computer program product carrying the computer program.

Another aspect of the invention provides a method of manufacturing a device using a lithographic projection apparatus including: a radiation system for providing a projection beam of radiation, a support structure for supporting a patterning device, the patterning device serving to pattern the projection beam according to a desired pattern, a substrate table for holding a substrate, a projection system for projecting the patterned beam onto a target portion of the substrate, the method including, providing a substrate which is at least partially covered by a layer of energy-sensitive material, providing a pattern it is desired to create on the substrate, providing patterning means on the support structure, creating a source intensity distribution in the radiation system which corresponds substantially to the sum of the selected source elements output by the above method, defining the pattern of the patterning device according to the pattern it is desired to image on the substrate modified according to the optical proximity correction rules output by the above method, and exposing a target area of the layer of energy-sensitive material on the substrate, using the patterned radiation beam, within the process window output by the above method, using the created source intensity distribution and the defined patterning device.

The invention also provides a device manufactured in accordance with the above method of manufacturing a device.

Although specific reference may be made in this text to the use of the apparatus according to the invention in the manufacture of ICs, it should be explicitly understood that such an apparatus has many other possible applications. For example, it may be employed in the manufacture of integrated optical systems, guidance and detection patterns for magnetic domain memories, liquid-crystal display panels, thin-film magnetic heads, etc. The skilled artisan will appreciate that, in the context of such alternative applications, any use of the terms "reticle," "wafer" or "die" in this text should be considered as being replaced by the more general terms "mask," "substrate" and "target portion," respectively.

In the present document, the terms "radiation" and "beam" are used to encompass all types of electromagnetic radiation, including ultraviolet radiation (e.g., with a wavelength of 365, 248, 193, 157 or 126 nm) and EUV (extreme ultra-violet radiation, e.g., having a wavelength in the range 5–20 nm), as well as particle beams, such as ion beams or electron beams.

BRIEF DESCRIPTION OF THE INVENTION

Embodiments of the invention will now be described, by way of example only, with reference to the accompanying schematic drawings in which.

Figure 4A:
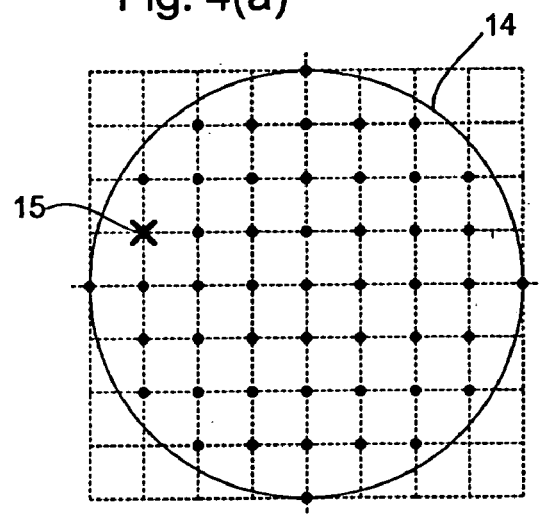
Figure 4B:
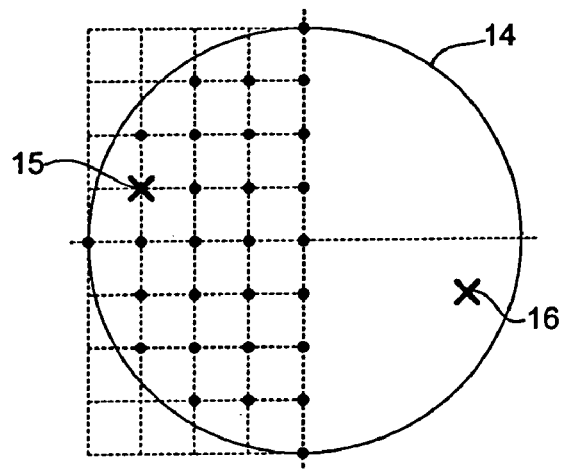
Figure 4C:
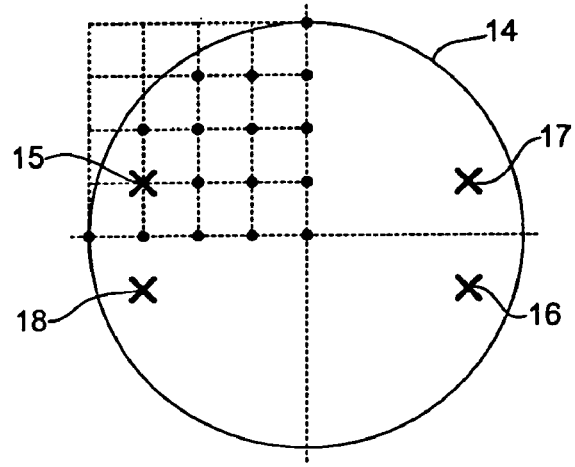
Figure 5:
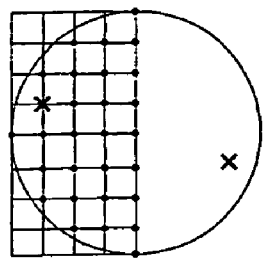
Figure 5:
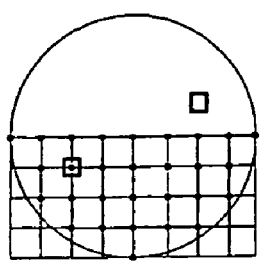
Figure 5:
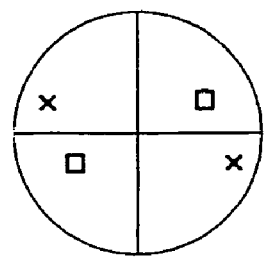
Figure 5:
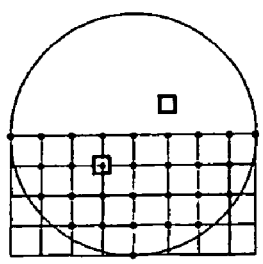
Figure 5:
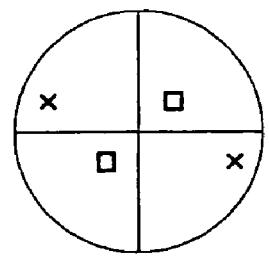
Figure 5:
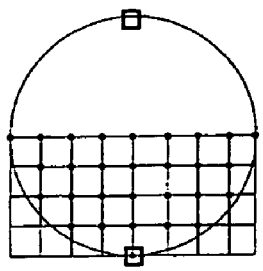
Figure 5:
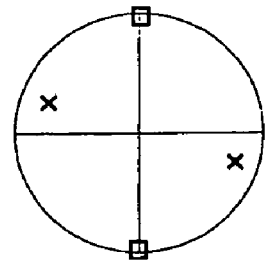
Figure 5:
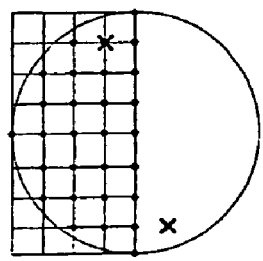
Figure 5:
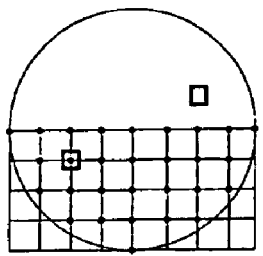
Figure 5:
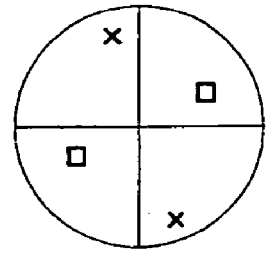
Figure 6A:
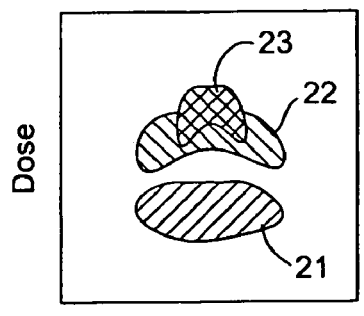
Figure 6B:
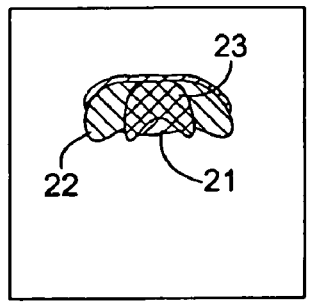
Figure 6C:
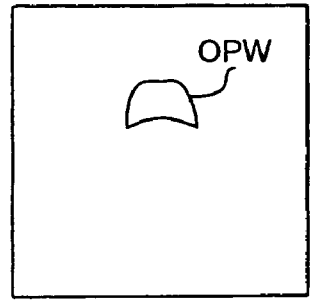
Figure 7:
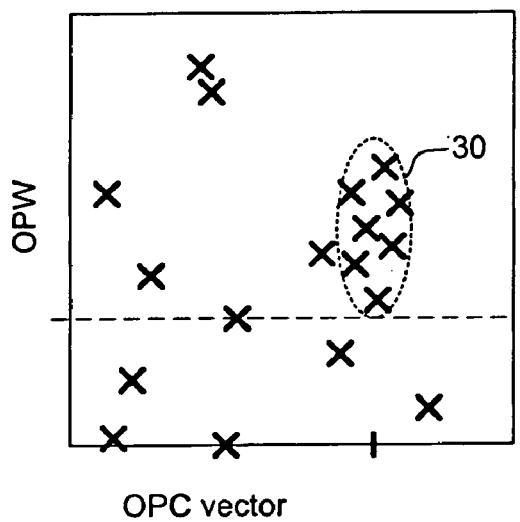

FIGS. 4(a), 4(b) and 4(c) depict different methods for dividing the radiation source into source elements;

FIG. 5 depicts schematically another construction for dividing the radiation source into elements according to a further embodiment of the invention;

FIGS. 6(a), 6(b) and 6(c) depict, schematically, the process windows for particular pattern features and the optimization of the overlapping process window; and FIG. 7 depicts, schematically, the selection of the source elements for the optimized radiation source based on the overlapping process windows and simultaneous optical proximity collection.

DETAILED DESCRIPTION OF THE DRAWINGS

Embodiment 1

Figure 1:
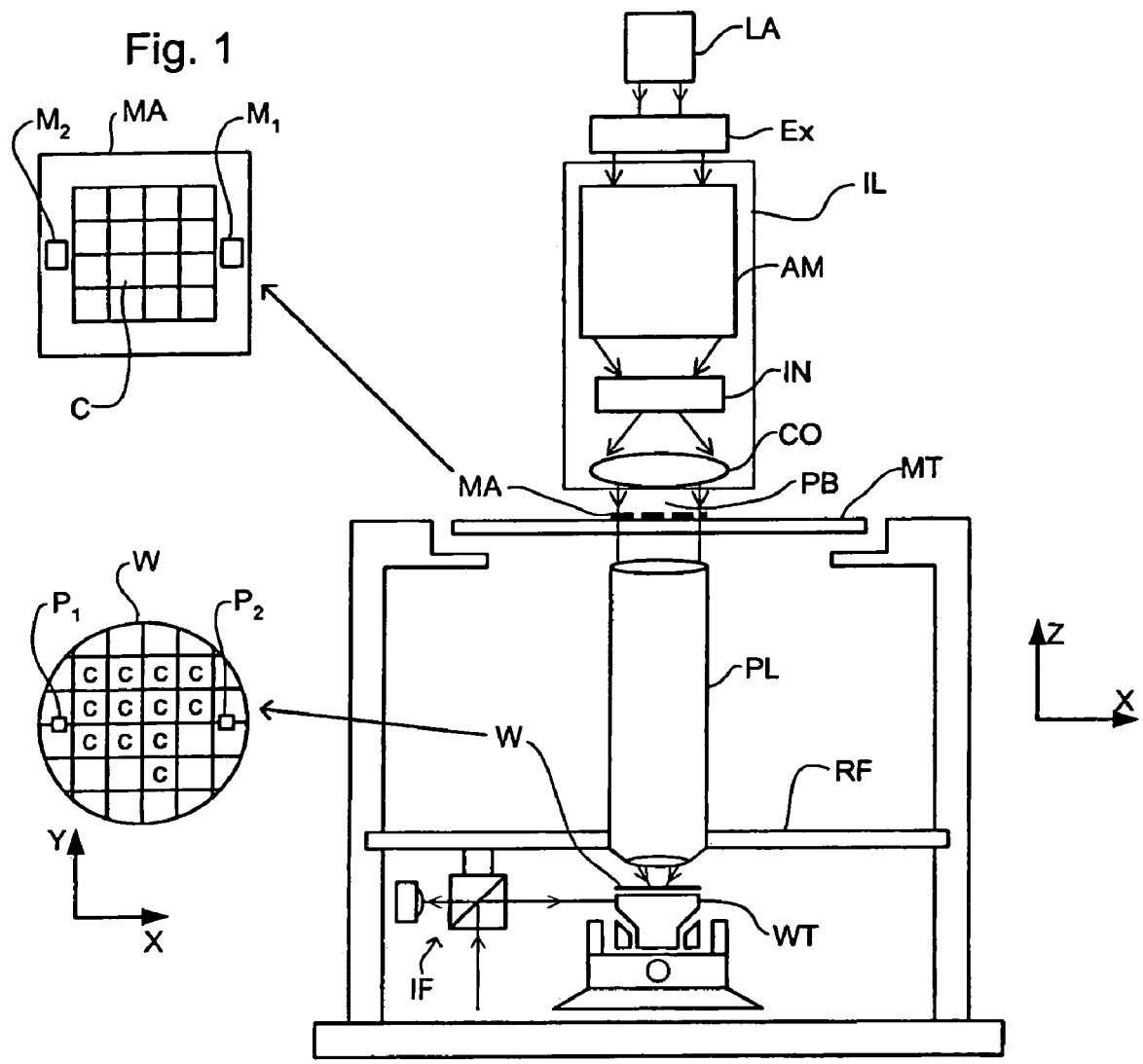
FIG. 1 depicts a lithographic projection apparatus according to an embodiment of the invention.

FIG. 1 schematically depicts a lithographic projection apparatus according to a particular embodiment of the invention. The apparatus comprises:

a radiation system Ex, IL, for supplying a projection beam PB of radiation (e.g., EUV radiation), which in this particular case also comprises a radiation source LA;

a first object table (mask table) MT provided with a mask holder for holding a mask MA (e.g., a reticle), and connected to first positioning means for accurately positioning the mask with respect to item PL;

a second object table (substrate table) WT provided with a substrate holder for holding a substrate W (e.g., a resist-coated silicon wafer), and connected to second positioning means for accurately positioning the substrate with respect to item PL;

a projection system ("lens") PL (e.g., a refractive or catadioptric system, a mirror group or an array of field deflectors) for imaging an irradiated portion of the mask MA onto a target portion C (e.g., comprising one or more dies) of the substrate W.

As here depicted, the apparatus is of a transmissive type (i.e., has a transmissive mask). However, in general, it may also be of a reflective type, for example (e.g., with a reflective mask). Alternatively, the apparatus may employ another kind of patterning means, such as a programmable mirror array of a type as referred to above.

The source LA (e.g., a Hg lamp, excimer laser, a discharge source, laser produced plasma LPP, an undulator provided around a path of an electron beam in a storage ring or synchrotron) produces a beam of radiation. This beam is fed into an illumination system (illuminator) IL, either directly or after having traversed conditioning means, such as a beam expander Ex, for example. The illuminator IL may comprise adjusting means AM for setting the outer and/or inner radial extent (commonly referred to as σ-outer and σ-inner, respectively) of the intensity distribution in the beam. In addition, it will generally comprise various other components, such as an integrator IN and a condenser CO. In this way, the beam PB impinging on the mask MA has a desired uniformity and intensity distribution in its cross-section.

It should be noted with regard to FIG. 1 that the source LA may be within the housing of the lithographic projection apparatus (as is often the case when the source LA is a mercury lamp, for example), but that it may also be remote from the lithographic projection apparatus, the radiation beam which it produces being led into the apparatus (e.g., with the aid of suitable directing mirrors); this latter scenario is often the case when the source LA is an excimer laser. The current invention and claims encompass both of these scenarios.

The beam PB subsequently intercepts the mask MA, which is held on a mask table MT. Having been selectively reflected by the mask MA, the beam PB passes through the lens PL, which focuses the beam PB onto a target portion C of the substrate W. With the aid of the second positioning means (and interferometric measuring means IF), the substrate table WT can be moved accurately, e.g., so as to position different target portions C in the path of the beam PB. Similarly, the first positioning means can be used to accurately position the mask MA with respect to the path of the beam PB, e.g., after mechanical retrieval of the mask MA from a mask library, or during a scan. In general, movement of the object tables MT, WT will be realized with the aid of a long-stroke module (course positioning) and a short-stroke module (fine positioning), which are not explicitly depicted in FIG. 1. However, in the case of a wafer stepper (as opposed to a step-and-scan apparatus) the mask table MT may just be connected to a short stroke actuator, or may be fixed.

The depicted apparatus can be used in two different modes:

1. In step mode, the mask table MT is kept essentially stationary, and an entire mask image is projected in one go (i.e., a single "flash") onto a target portion C. The substrate table WT is then shifted in the x and/or y directions so that a different target portion C can be irradiated by the beam PB;

2. In scan mode, essentially the same scenario applies, except that a given target portion C is not exposed in a single "flash." Instead, the mask table MT is movable in a given direction (the so-called "scan direction," e.g., the y direction) with a speed v, so that the projection beam PB is caused to scan over a mask image; concurrently, the substrate table WT is simultaneously moved in the same or opposite direction at a speed V=Mv, in which M is the magnification of the lens PL (typically, M=¼ or ⅕). In this manner, a relatively large target portion C can be exposed, without having to compromise on resolution.

Figure 2:
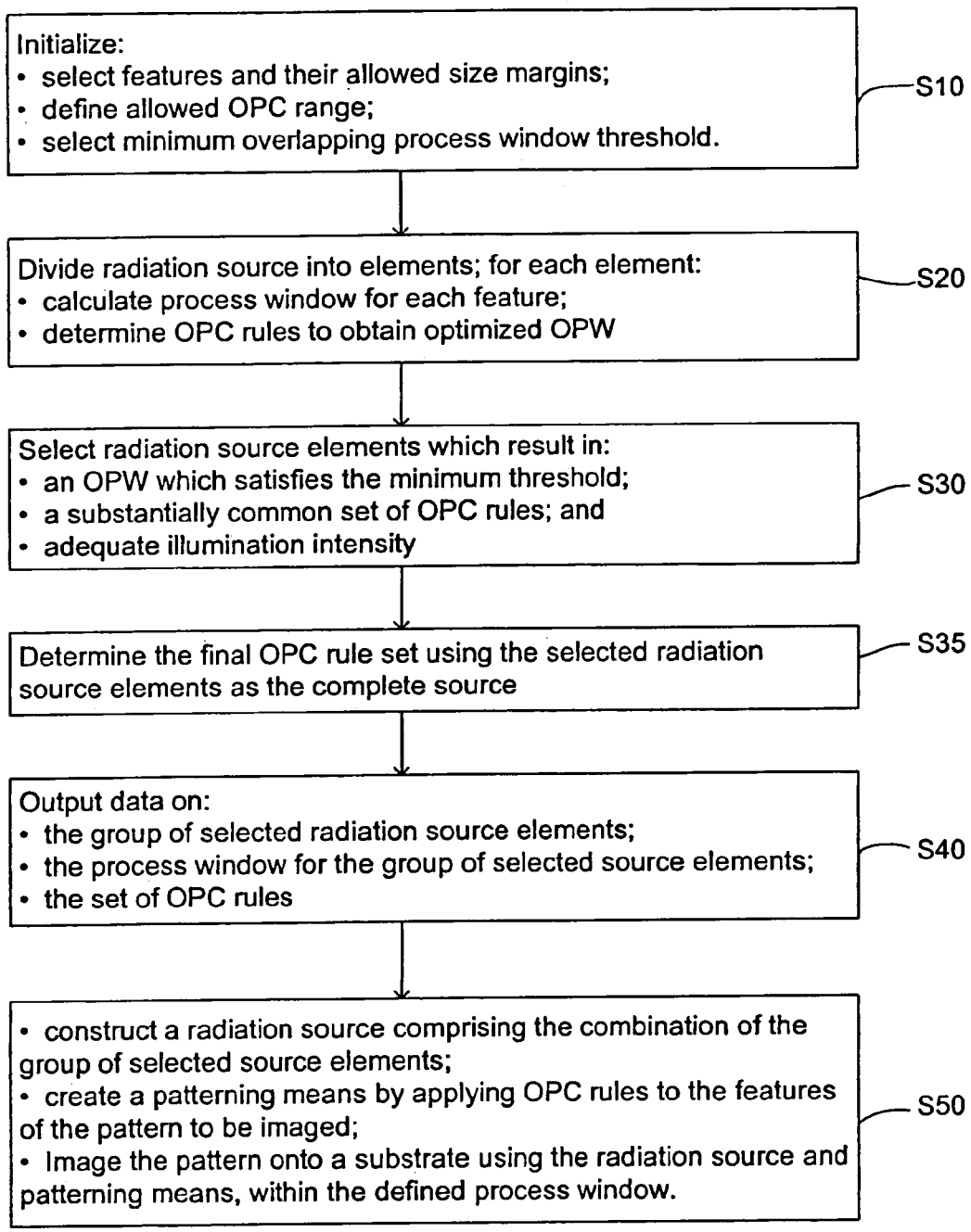
FIG. 2 is a flow chart showing an outline of a method embodying the invention.
Figure 3:
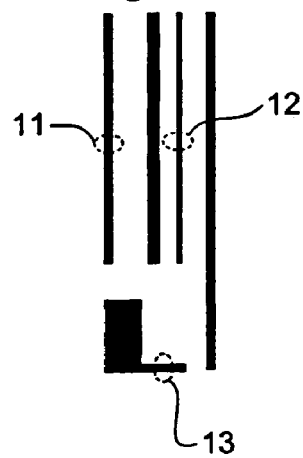
FIG. 3 depicts, schematically, features of a pattern to be imaged.

FIG. 2 shows a flow chart of a method embodying the invention for use with the lithographic projection apparatus of FIG. 1. In S10, for a pattern which it is desired to image on to a substrate, a plurality of features are selected and their allowed size margins, i.e., critical dimensions, are specified. FIG. 3 shows schematically a portion of a pattern to be imaged and three features 11, 12, 13 indicated by the rings are examples of selected features. Further initialization is done in S10 to define the allowed optical proximity correction (OPC) range, i.e., the limits to the amount of biasing (e.g., widening or lengthening) of features that can be permitted and limits on the assist feature sizes, and to select parameters reflecting the minimum overlapping process window OPW threshold that is acceptable. The lower limit that describes what OPW is still acceptable can be defined in terms of: 1) maximum focus latitude of the OPW; 2) maximum exposure latitude of the OPW; 3) a function of 1) and 2) for example the product of the two; 4) the area of the OPW; or 5) a combination of the above factors, for example, combined using logical operators such as AND and OR.

The preceding actions and also S20 to S40 do not have to be performed on an actual lithographic projection apparatus as depicted in FIG. 1, but may be performed using a computer model that simulates the physical apparatus and so the pattern, illumination system, projection lens and so on are represented as digital data. Thus references to these items should, of course, be read to include corresponding virtual items in a computer model.

In S20, the radiation source is notionally divided into elements. Note that the expressions "radiation source" or equivalently "projection beam source" used herein could refer to the actual source that generates the radiation, such as a laser, or could, for example, refer to a portion in the radiation path which acts as a virtual or "secondary" source, such as an integrator or other means which has conditioned the radiation, and which effectively acts as a "source" for subsequent items in the beam path. In the following embodiments the radiation source comprises the beam at a pupil in the illumination system. The pupil is typically circular and is represented schematically by the circle 14 in FIG. 4(a). The complete radiation source has an intensity distribution as a function of position in the pupil 14 that corresponds to the angular intensity distribution of radiation incident on the mask.

As mentioned above, for the calculation according to the method of this embodiment, the radiation source is divided into a plurality of elements, each element corresponding to a region or pixel of the source. Each source element may be either "on" or "off." The overall source can be considered to be the sum of the elements that are "on." To simplify the calculation, each source element can be approximated by a point source, such as indicated by the cross 15 in FIG. 4(a). According to one embodiment the calculation described below for S20 is performed in turn for every elemental region into which the source has been divided, i.e., every point on the grid in FIG. 4(a), to span the complete pupil.

However, it is often required that the source at the pupil have certain symmetry for reasons of telecentricity, i.e., preferably the center of gravity of the distribution should lie at the center of the pupil. Consequently, according to another embodiment shown in FIG. 4(b), it suffices to construct a symmetrical source by dividing the pupil 14 into two halves with each source element for the calculation comprising two sub-elements 15, 16, one in each half, and diametrically opposite each other with respect to the optical axis (center of the pupil). Thus a single source "element" for the purposes of the calculation can be composed of a number of sub-elements 15, 16. In this example, the amount of calculation is reduced to one half by considering sources in only one half (indicated by the grid on the left half of FIG. 4(b)) and using the symmetry to produce the sources in the other half.

According to a further embodiment, shown in FIG. 4(c), the pupil is divided in quadrants, and each source element comprises four sub-elements obtained by reflecting the point source 15 in the first quadrant about the vertical and horizontal axes to produce the sources indicated by the crosses at 16, 17 and 18 in the other three quadrants. In practice this can work just as well because of the fact that the positive and negative orders of the diffraction pattern are generally identical, and will reduce the amount of computation to approximately one quarter.

As shown in FIGS. 4(a), (b) and (c) the source elements lie on a rectangular grid, but this is purely one example of constructing the source elements; any other suitable division may be used, depending on the circumstances, such as a hexagonal grid or point sources arranged according to polar coordinates. The source pupil 14 could also be divided into six or another number of regions other than two or four. The exact location of the grid areas within the pupil can be purely arbitrary.

A further improved embodiment for creating composite source elements, i.e., source elements composed of multiple point sources, will be described with reference to FIG. 5. (i) The left half of the pupil is divided into a grid of N points as shown in the upper left portion of FIG. 5. One of these points is chosen together with the corresponding symmetric point in the right half of the pupil, as shown by the two crosses. (ii) The bottom half of the pupil is divided into a grid of M points (M can be the same as N), and a further pair of symmetric source points is chosen, shown by the two small squares in the upper center illustration of FIG. 5. (iii) The final chosen source element used for the calculation of S20, described below, is the sum of the two source pairs from steps (i) and (ii), i.e., the source element comprises four sub-elements depicted by two crosses and two squares in the upper right portion of FIG. 5. Actions (ii) and (iii) are then iterated M times going through all M "top/bottom" source point pairs, keeping the source pair from (i) the same; then returning to (i) the "left/right" source pair is incremented to the next pair of points, followed by iteration of (ii) and (iii) another M times. This is repeated until all N "left/right" source pairs have been evaluated with all M "top/bottom" source pairs, giving a total of M*N source elements, schematically depicted in the right hand column of FIG. 5. The analysis of OPC and OPW described below is performed for each of these M*N source elements for each selected pattern feature.

The division of the source pupil into left/right and top/bottom halves by horizontal and vertical dividing lines can be otherwise than depicted, e.g., rotated by an arbitrary angle and/or not necessarily orthogonal to each other. The only criterion is that the directions of the dividing lines are not identical. This embodiment has been described with respect to dividing the pupil into halves (as in FIG. 4(b)), but could equally be done with no division as in FIG. 4(a) or division into quadrants as in FIG. 4(c), or any other division.

Continuing through S20, for each source element (e.g., composed of sub-elements 15, 16, 17 and 18 of FIG. 4(c)) the process window for each selected feature is calculated, for example as described in "Inside Prolith" by Chris A Mack 1997 (ISBN 0-9650922-0-8), particularly chapter 10.

FIG. 6(a) illustrates schematically, for one source element, the process windows 21, 22 and 23 for the selected features 11, 12 and 13. The process windows define the ranges of dose and focus (i.e., exposure latitude EL and focus latitude (depth of focus DOF)) which will result in acceptable printing of the feature within the defined size margins. The OPC rules are then determined which optimize the overlapping of the process windows. This can be straightforward e.g., by applying bias to the structures with the larger spacing, in order to effectively decrease the local dose. As the local dose is effectively decreased, then the process window for that feature is pushed up so that a higher dose is required to expose that feature. This is represented schematically in FIG. 6(b) where the result of applying the determined OPC rules has shifted the process windows, 21, 22 and 23 from FIG. 6(a) such that they maximally overlap. As well as or instead of applying biasing, the use of assist features can be included in the OPC rules to optimize the overlapping of the process windows. More information on determining OPC rules can be obtained from "Silicon Processing" by S Wolf and R N Tauber (ISBN 0-9616721-6-1) and from references to literature contained therein. Said result of applying the determined OPC rules may affect, in addition to the position of a process window along the dose and focus axes in FIG. 6(b), the shape and or size of a process window in FIG. 6(b). Therefore, according to the invention, an additional step of calculating changes of shape and or size of the process windows 21, 22, and 23, followed by additional steps of determining OPC rules which optimize the overlapping of the process windows and of applying the determined OPC rules, can be included in the method.

FIG. 6(c) shows the resulting overlapping process window OPW representing the available process window in which the selected features can all be successfully printed for the given source element and by applying the calculated OPC rules. This is repeated such that for each source element a set of OPC rules is determined and an optimized OPW is obtained.

FIG. 7 is a schematic plot of the results of S20. Each cross represents a plot of the OPC and OPW for a particular source element. FIG. 7 is purely a schematic 2D-plot to assist understanding of the invention. In practice, each set of OPC rules can be represented mathematically as a multidimensional vector and the crosses lie in a multidimensional vector space. As explained previously, the OPW can be characterized by many parameters, for example exposure latitude, focus latitude, window area or combinations thereof. The OPW criteria can be combined into one value which is plotted vertically in FIG. 7. For example, the quantity plotted vertically could represent the function: [Maximum DOF of the OPW] with a threshold on [Maximum DOF of the OPW] AND a threshold on [Maximum Exposure Latitude of the OPW]. Mathematically this function is written: MaxDOF & (MaxDOF>F & MaxEL>E). This will plot the MaxDOF for those source points where the MaxDOF is larger than a chosen value F and simultaneously MaxEL is larger than a chosen value E. This is merely an example. Many other combinations can be thought of.

According to S30, the radiation source elements must be evaluated and those selected which are to form the intensity distribution of the optimized source. Firstly, the selected source elements must have an OPW which meets the minimum threshold specified in S10. The threshold is indicated by the dashed horizontal line in FIG. 7. The threshold might be, for example, that the maximum depth of focus (DOF) is greater than 0.3 µm and the maximum exposure latitude (EL) is greater than 7%. In this example the threshold uses more than one parameter. The source elements corresponding to the crosses below that line can be eliminated. Effectively this could be done using the function described above for plotting the points in FIG. 7.

Secondly, the source elements must have a substantially common set of OPC rules such that there is consistency when designing the patterning structure, such as the mask. According to one method embodying the invention this is done by identifying a region in the plot of FIG. 7 that has a high density of crosses with a similar OPC. A suitable region is indicated by the dashed ellipse 30 in FIG. 7. Mathematically speaking, this portion of the method looks for a region in the multidimensional OPC vector space that has a high density of points. Points are then selected starting in the high density region with the primary criterion that there must be enough source elements such that the overall illumination is adequately bright; for example, for practical purposes at least 10% of the area of the source pupil must be illuminated. Hence there are not necessarily any strict limits on the range of OPC values of the selected source elements; it will depend on the density of points for any particular case, however, the preferred criterion is, of course that the OPC values are nearly identical as possible, such that the spread of OPC values of selected source element points is minimized.

It is, of course, understood that for the method of the invention it is not necessary to plot the source element points as in FIG. 7, and indeed this would not be physically possible for multidimensional OPC vectors. Instead, FIG. 7 is simply an illustration to assist understanding of the invention. The calculation can be done by a processor manipulating the relevant data.

After the set of source elements has been selected, the final set of OPC rules is determined in S35. The set of OPC rules is effectively given by the OPC vector that approximates to the common OPC vector for these selected source elements. Preferably, in S35, the final set of OPC rules is determined using the entire optimized source, comprising the sum of the selected source elements, rather than using the source elements separately. The OPC rules are determined using known software routines, as explained previously, that optimize the OPW.

In S40, the results of the optimization method are output. The results comprise data representing the group of selected radiation source elements and the set of OPC rules. Optionally, the process window for the group of selected source elements can also be output, but this is not essential. Referring to FIG. 7, the group of selected radiation source elements are those which correspond to the crosses within the region 30. The optimized radiation source intensity distribution is given by the sum of these elements. The process window information can assist with the correct exposure of the pattern using the OPC rules and the optimized source, but this information is not essential for setting up a lithography apparatus such a stepper or scanner.

The apparatus for performing the method of S10 to S40 does not have to be part of the lithographic projection apparatus of FIG. 1 and can be a conventional computer system that has access to the data representing the pattern to be imaged and the physical performance of the protection apparatus. Of course, the apparatus can be a system dedicated for use with the lithographic projection apparatus. The computer system for performing the calculation of the optimal or near-optimal radiation source and OPC may comprise software for performing a method embodying the invention stored in a data store and executed by a processor.

Optionally, one or more of the parts of the further action S50 of FIG. 2 can be performed. The data output on the group of selected radiation source elements, which comprise the desired intensity distribution of the source can be used to construct an actual radiation source having that intensity distribution. This may be done by including one or more beam-defining members in the illuminator IL of the projection apparatus, for example comprising optical means such as a grey filter or spatial filter, or any suitable refractive, reflective, diffractive or filtering means for defining the intensity distribution. Furthermore, the data on the set of optimized OPC rules can be applied to the desired pattern to design a patterning means, such as a mask, for use in exposing a substrate. Finally, the method can include imaging the pattern onto a substrate using the radiation source and patterning structure above and exposing the image within the process window obtained at S40.

While specific embodiments of the invention have been described above, it will be appreciated that the invention may be practiced otherwise than as described. The description is not intended to limit the invention.

The invention claimed is:

1. A method for determining a projection beam source intensity distribution and optical proximity correction rules for a patterning structure for use with a lithographic projection apparatus comprising:
    patterning a projection beam according to a desired pattern;
    selecting a plurality of features of the desired pattern to be imaged;
    notionally dividing the radiation in the radiation system into a plurality of source elements;
    for each source element:
        calculating a process window for each selected feature and determining the optical proximity correction rules that optimize the overlap of the calculated process windows;
        selecting those source elements for which the overlapping of the process windows and the optical proximity correction rules satisfy specified criteria; and
        outputting data relating to the selected source elements, which define a source intensity distribution and optical proximity correction rules.

2. A method according to claim 1, further comprising projecting the patterned beam onto a target portion of a substrate.

3. A method according to claim 1, wherein one criterion for the selecting source elements is that the overlapping process window exceeds a predetermined threshold.

4. A method according to claim 1, wherein one criterion for the selecting source elements is that the optical proximity correction rules for the selected elements are substantially the same.

5. A method according to claim 1, wherein selecting the source elements comprises identifying a region in a vector space, defined by the optical proximity rules, which has a high density of source elements.

6. A method according to claim 1, further comprising calculating the outputted optical proximity correction rules on the basis of a source intensity distribution that corresponds to the sum of the selected source elements.

7. A method according to claim 1, wherein each source element comprises four sub-elements, symmetrically disposed, one in each quadrant of the source.

8. A method according to claim 1, wherein each source element comprises at least one set of two sub-elements, said two sub-elements being disposed in opposite halves of the source.

9. A method according to claim 1, wherein said dividing the radiation into a plurality of source elements further comprises:
    choosing a first set of sub-elements;
    choosing a second set of sub-elements; and
    creating combinations of the first and second set of sub-elements as each of the source elements in turn.

10. A method according to claim 1, further comprising producing a beam-defining member, insertable into the radiation system, for creating a source intensity distribution in the radiation system which corresponds substantially to the sum of the outputted selected source elements.

11. A method according to claim 1, further comprising producing a patterning structure, wherein the pattern of the patterning structure contains optical proximity correction features according to the outputted optical proximity correction rules.

12. A computer system comprising a processor and a storage, the processor being adapted to process data in accordance with an executable program stored in the storage, wherein the executable program comprises machine executable instructions for performing the method of claim 1.

13. A machine readable medium comprising machine executable instructions for performing the method of claim 1.

14. A method of manufacturing a device using a lithographic projection apparatus comprising:
    creating a source intensity distribution in a radiation system of the lithographic apparatus for producing a projection beam which corresponds substantially to a sum of the selected source elements output by the method of claim 1;
    defining a pattern of patterning structure for patterning the projection beam containing the optical proximity correction rules output by the method of claim 1; and
    exposing a target area of a layer of energy-sensitive material on a substrate, using the patterned radiation beam.

15. A device manufactured in accordance with the method of claim 14.

16. A method of producing an imaging configuration for a lithographic projection apparatus comprising:
    selecting a pattern to be imaged;
    selecting a plurality of imaging source elements;
    calculating respective process parameters for selected features of the pattern;
    determining optimized optical proximity correction rules for the process parameters; and
    selecting optical proximity correction patterns for inclusion in a patterning structure to be used with the lithographic projection apparatus according to the determined optical proximity correction rules.

* * * * *